United States Patent [19]
Bennett et al.

[11] Patent Number: 5,592,160
[45] Date of Patent: Jan. 7, 1997

[54] METHOD AND APPARATUS FOR TRANSMISSION CODE DECODING AND ENCODING

[75] Inventors: Dwayne Bennett, Scarborough; Clifford Yeung, Richmond Hill; Wayne Wu, Rexdale, all of Canada

[73] Assignee: Hewlett-Packard Company, Palo Alto, Calif.

[21] Appl. No.: 548,504

[22] Filed: Oct. 26, 1995

[51] Int. Cl.$^6$ .................................................. H03M 7/14
[52] U.S. Cl. ................................................ 341/58; 341/95
[58] Field of Search .................................. 341/51, 58, 95

[56] References Cited

U.S. PATENT DOCUMENTS

| | | | |
|---|---|---|---|
| 3,761,697 | 9/1973 | Darton et al. | 341/95 |
| 5,126,999 | 6/1992 | Munter et al. | 370/60 |
| 5,130,975 | 7/1992 | Akata | 370/60 |
| 5,136,582 | 8/1992 | Firoozmand | 370/85.1 |
| 5,185,736 | 2/1993 | Tyrrell et al. | 370/55 |
| 5,247,626 | 9/1993 | Firoozmand | 395/250 |
| 5,255,266 | 10/1993 | Watanabe et al. | 370/60.1 |
| 5,291,481 | 3/1994 | Doshi et al. | 370/60 |
| 5,313,582 | 5/1994 | Hendel et al. | 395/250 |
| 5,357,506 | 10/1994 | Sugawara | 370/60 |
| 5,365,522 | 11/1994 | Peeters | 370/60.1 |
| 5,384,773 | 1/1995 | Olnowich et al. | 370/60.1 |
| 5,390,184 | 2/1995 | Morris | 370/94.2 |
| 5,418,779 | 5/1995 | Yemini et al. | 370/54 |
| 5,436,894 | 7/1995 | Wallmeier et al. | 370/60.1 |

*Primary Examiner*—Todd DeBoer
*Attorney, Agent, or Firm*—Richard F. Schuette

[57] ABSTRACT

A method and apparatus for high speed decoding of a 20 bit wide data into 16-bit wide data in which the first ten bits and the lower ten bits are decoded simultaneously to ensure complete decoding and where the decoding of the second ten bits is dependent upon the running disparity of the first ten bits, the second ten bits are decoded twice, one assuming the decoded first ten bits will have a positive running disparity, and a second time assuming that the decoded first ten bits will have a negative running disparity.

12 Claims, 6 Drawing Sheets

METHOD AND APPARATUS FOR TRANSMISSION CODE DECODING AND ENCODING

FIELD OF THE INVENTION

The present invention relates to methods and apparatus for decoding 10-bit transmission codes into 8-bit bytes on the transmission side of a fibre channel network port.

BACKGROUND OF THE INVENTION

Mainframes, super computers, mass storage systems, workstations and very high resolution display subsystems are frequently connected together to facilitate file and print sharing. Common networks and channels used for these types of connections may limit system performance by placing restraints on data flow rates, especially in cases where the data is in a large file format typical of graphically-based applications.

There are two basic types of data communications connections between processors, and between a processor and peripherals. A "channel" provides a direct or switched point-to-point connection between communicating devices. The channel's primary task is merely to transport data at the highest possible data rate with the least amount of delay. Channels typically perform simple error correction in hardware. A "network," by contrast, is an aggregation of distributed nodes (e.g., workstations, mass storage units) with its own protocol that supports interaction among these nodes. Typically, each node contends for the transmission medium, and each node must be capable of recognizing error conditions on the network and must provide the error management required to recover from the error conditions One type of communications interconnect that has been developed is Fibre Channel. The Fibre channel protocol was developed and adopted as the American National Standard for Information Systems (ANSI). See *Fibre Channel Physical and Signaling Interface,* Revision 4.2, American National Standard for Information Systems (ANSI) (1993) for a detailed discussion of the fibre channel standard. Briefly, fibre channel is a switched protocol that allows concurrent communication among workstations, super computers and various peripherals. The total network bandwidth provided by fibre channel is on the order of a terabit per second. Fibre channel is capable of transmitting frames at rates exceeding 1 gigabit per second in both directions simultaneously. It is also able to transport commands and data according to existing protocols such as Internet protocol (IP), small computer system interface (SCSI), high performance parallel interface (HIPPI) and intelligent peripheral interface (IPI) over both optical fiber and copper cable.

Essentially, the fibre channel is a channel-network hybrid, containing enough network features to provide the needed connectivity, distance and protocol multiplexing, and enough channel features to retain simplicity, repeatable performance and reliable delivery. Fibre channel allows for an active, intelligent interconnection device known as a fibre channel switch to connect devices. The fibre channel switch includes a plurality of fabric-ports (F_ports) that provide for interconnection and frame transfer between a plurality of node-ports (N_ports) attached to associated devices that may include workstations, super computers and/or peripherals. The fibre channel switch has the capability of routing frames based upon information contained within the frames. The N_port manages the simple point-to-point connection between itself and the fabric. The type of N_port and associated device dictates the rate that the N_port transmits and receives data to and from the fabric. Transmission is isolated from the control protocol so that different topologies (e. g., point-to-point links, rings, multidrop buses, cross point switches) can be implemented.

The Fibre Channel industry standard also provides for several different types of data transfers. A class 1 transfer requires circuit switching, i.e., a reserved data path through the network switch, and generally involves the transfer of more than one frame, oftentimes numerous frames, between two identified network elements. In contrast, a class 2 transfer requires allocation of a path through the network switch for each transfer of a single frame from one network element to another.

Frame switching for class 2 transfers is more difficult to implement than class 1 circuit switching as frame switching requires a memory mechanism for temporarily storing incoming frames prior to their routing to another port. A memory mechanism typically includes numerous input/output (I/O) connections with associated support circuitry. Additional complexity and hardware is required when channels carrying data at different bit rates are to be interfaced.

Thus, a heretofore unaddressed need exists in the industry for new and improved systems for implementing the Fibre Channel industry standard for class 2 transfers on fiber optic networks with much higher performance and flexibility than presently existing systems. Particularly, there is a significant need for a method and apparatus for transmission code decoding and encoding at two characters per clock cycle.

SUMMARY OF THE INVENTION

A preferred embodiment of the present invention is a method and apparatus for high speed (up to 53 Mhz) decoding 20 bit wide data received from an optical interface into 16-bit wide data. The first ten bits and the lower ten bits are decoded simultaneously to ensure complete decoding at high speed. The decoding of the second ten bits is dependent upon the running disparity of the first ten bits, the second ten bits are decoded twice, one assuming the decoded first ten bits will have a positive running disparity, and a second time assuming that the decoded first ten bits will have a negative running disparity. The running disparity of the first ten bits is then employed for selecting the correct second decoded ten bits. In particular, a first 10-bit 10/8 bit decoder is employed for translating the first 10-bits of the 20 bit data into a first 8-bits, and a positive second 10-bit 10/8 bit decoder is employed for translating second 10-bits into 8-bits and a second negative 10 -bit 10/8 bit decoder is employed for translating the second 10-bits into 8-bits. The running disparity into the first 10-bit decoder is based on the last 20 bit data decoded. The running disparity out of the first decoder is employed for actuating a multiplexer to select either the output of the positive running disparity decoder or the output of the negative running disparity decoder. The 16-bit output is obtained by concatenating the 8-bit output of the first 10-bit 10/8 bit decoder and the 8-bit output of the multiplexer.

In an alternative embodiment, the invention is employed as a method and apparatus for encoding a 16-bit data word received from a transmission FIFO into a 20-bit wide data word. A special character encoder is employed for encoding the top 8-bits [15:8] of the 16-bit into 10-bits and for generating a running disparity signal. A negative disparity encoder and a positive disparity encoder are employed for simultaneously encoding the lower 8-bits [7:0] of the 16-bit word with a negative disparity and with a positive disparity. The 10-bit encoded outputs are input into a multiplexer controlled by the running disparity signal to select the 10-bit output of either the negative disparity encoder or the positive disparity encoder.

DETAILED DESCRIPTION OF THE PREFERRED EMBODIMENTS

I. FIBRE CHANNEL SWITCH ARCHITECTURE

Figure 1:
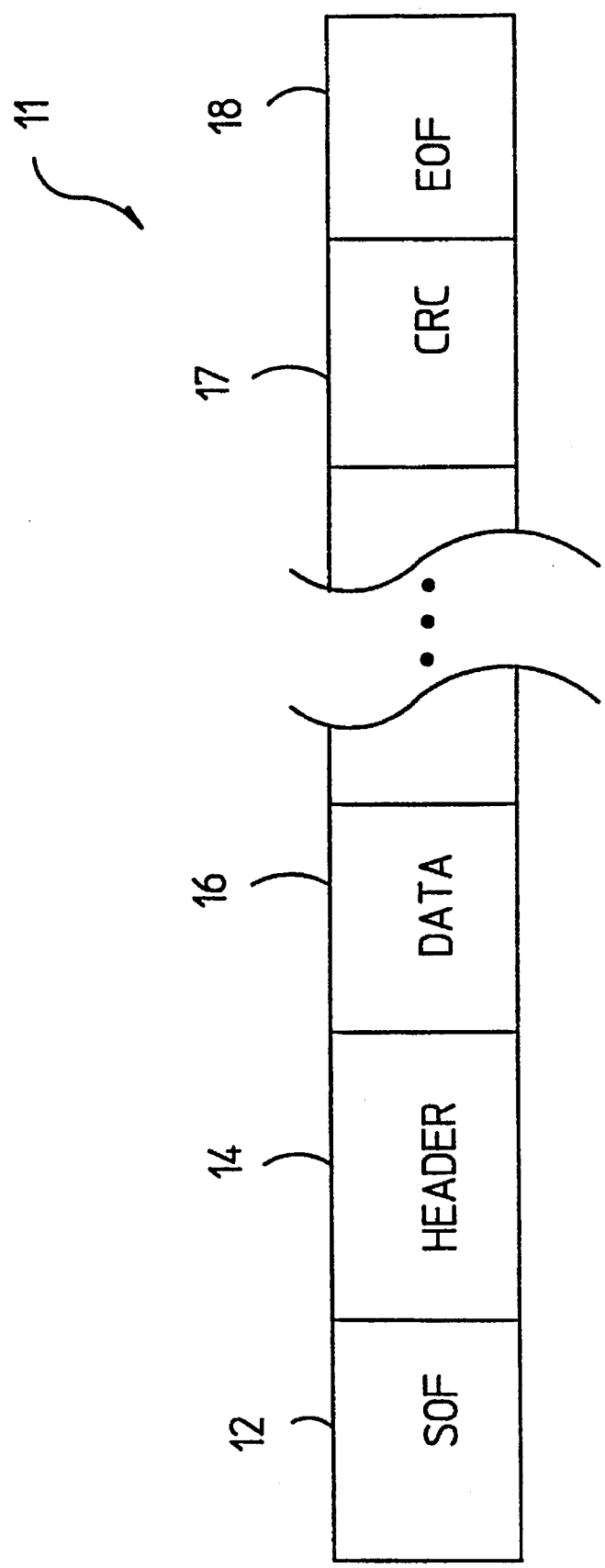
FIG. 1 is a schematic diagram of a prior art variable-length frame communicated through a fiber optic network in accordance with the Fibre Channel industry standard.

With reference now to the drawings wherein like reference numerals designate corresponding parts throughout the several views, a variable-length frame 11 is illustrated in FIG. 1. The variable-length frame 11 comprises a 4-byte start-of-frame (SOF) indicator 12, which is a particular binary sequence indicative of the beginning of the frame 11. The SOF indicator 12 is followed by a 24-byte header 14, which generally specifies, among other things, the frame source address and destination address as well as whether the frame 11 is either control information or actual data. The header 14 is followed by a field of variable-length data 16. The length of the data 16 is 0 to 2112 bytes. The data 16 is followed successively by a 4-byte CRC (cyclical redundancy check) code 17 for error detection, and by a 4 byte end-of-frame (EOF) indicator 18. The frame 11 of FIG. 1 is much more flexible than a fixed frame and provides for higher performance by accommodating the specific needs of specific applications.

Figure 2:
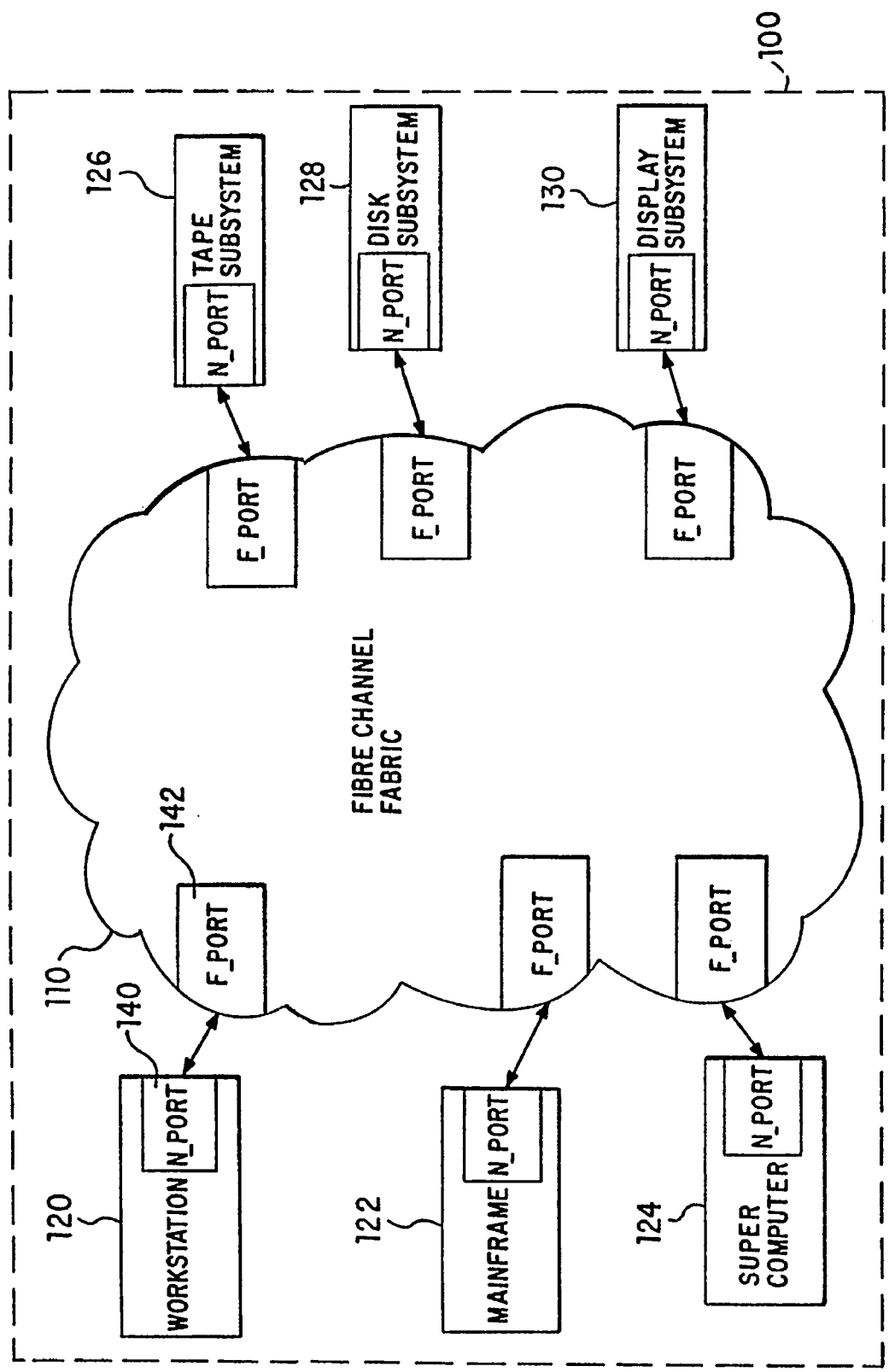
FIG. 2 shows a block diagram of a representative Fibre Channel architecture.

FIG. 2 illustrates a block diagram of a representative prior art fibre channel architecture in a fibre channel network 100. A workstation 120, a mainframe 122 and a super computer 124 are interconnected with various subsystems (e.g., a tape subsystem 126, a disk subsystem 128, and a display subsystem 130) via a fibre channel fabric 110 (i.e. fibre channel switch) . The fabric 110 is an entity that interconnects various node-ports (N_ports) and their associated workstations, mainframes and peripherals attached to the fabric 110 through the F_ports. The essential function of the fabric 110 is to receive frames of data from a source N_port and, using a first protocol, route the frames to a destination N_port. In a preferred embodiment, the first protocol is the fibre channel protocol. Other protocols, such as the asynchronous transfer mode (ATM) could be used without departing from the scope of the present invention.

As used herein, these terms and phrases are defined as follows:

Class 1 service—a circuit-switched connection;

Class 2 service—a frame-switched link providing guaranteed delivery and receipt notification;

Class 3 service—a frame-switched service with no confirmation;

F_port—"fabric" port, the access point of the Fabric that an N_port physically connects;

Fabric—a Fibre Channel-defined interconnection that handles routing in Fibre Channel networks;

Frame—a linear set of transmitted bits that define a basic transport element;

Intermix—a class of service that provides functionality of both Class 1 and 2, Intermix reserves the full channel for a Class 1 connection while allowing Class 2 traffic to pass on unused bandwidth;

Link—a communications channel;

N_port—"node" port, a Fibre Channel-defined hardware entity at the node end of a link.

Figure 3:
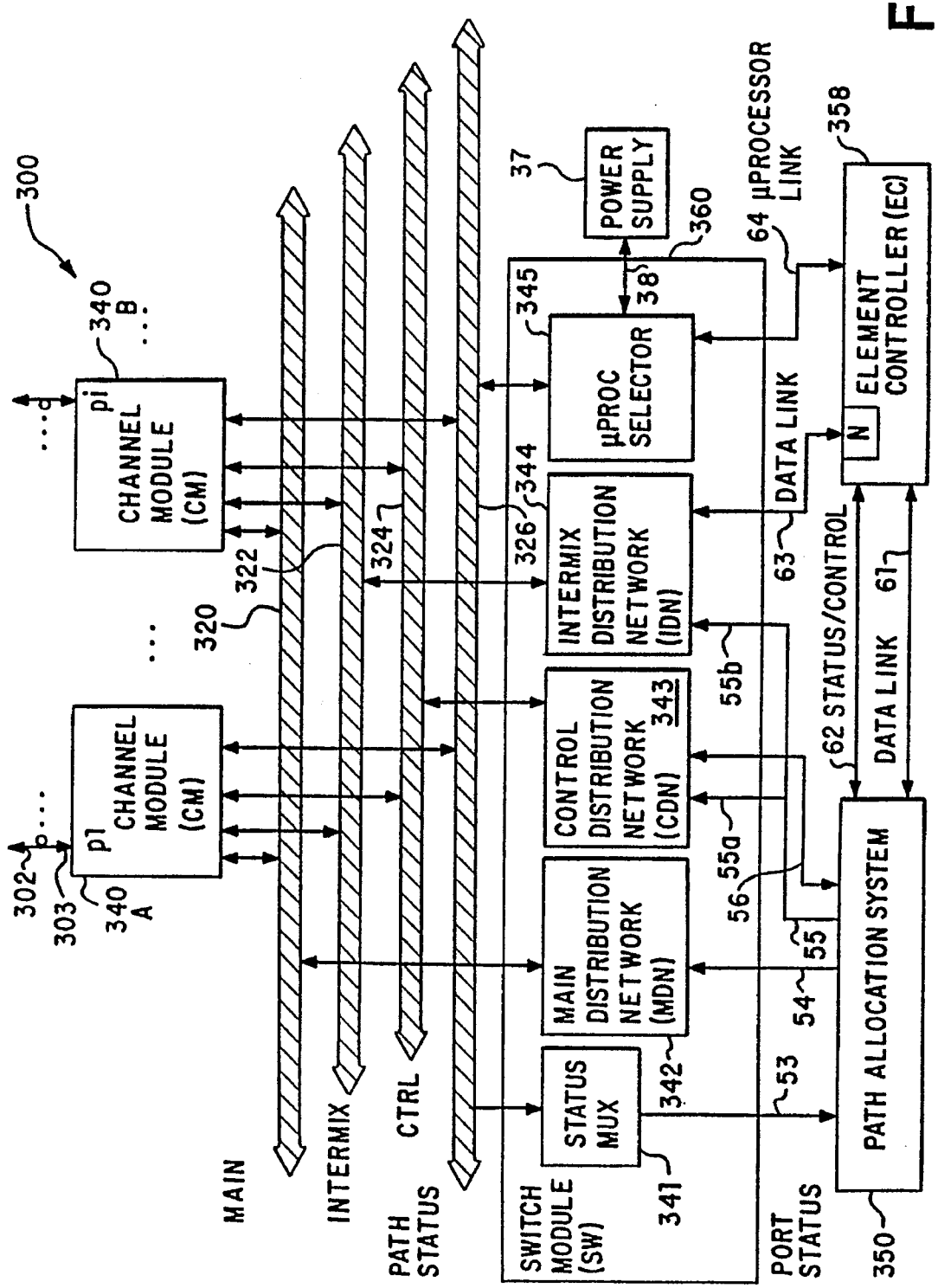
FIG. 3 is a schematic circuit diagram of the invention illustrating a high performance fiber optic switch constructed according to the present invention which utilizes a plurality of channel modules.

The fibre channel switch 300 illustrated in FIG. 3 employs a plurality of channel modules 340. Although FIG. 3 illustrates two channel modules 340 A and 340 B, the number of channel modules 340 may be greater than illustrated and is typically dependent upon system configuration. In a first embodiment, the fibre channel switch has four (4) channel module cards, each containing four 266 MBaud F_ports (providing for the interconnection of sixteen F_ports and associated computers and peripherals). The architecture provides for the substitution of the four 266 Mbaud channel module cards with either dual port 531 Mbaud channel module cards or a single port 1063 MBaud channel module. Each channel module 340 is coupled directly to a main link 320, an intermix link 322, a control link 324 and a path status link 326. Control signals over the control link 324 direct the transfer of frames received by one channel module 340 to a different port on the same channel module or to any other available channel module 340. The channel modules 340 provide port intelligence for data communication with the channels, buffered receive memory for temporarily storing frames for class 2 data transfers, as well as a bypass such that incoming frames are not buffered during class 1 data transfers. A path allocation system 350 communicates with the channel modules 340 through a switch module 360.

For frame-switched traffic (class 2), the path allocation system 350 collects frame header information for each frame from the receiving ports of channel module 340. The path allocation system 350 verifies the validity of the frame header information and allocates switch resources to set up a path for the frame, through the switch to the destination port. Once the frame has been forwarded, the path allocation system 350 de-allocates the switch resources.

The path allocation system 350 also collects frame header information for circuit switched traffic (Class 1 connect frames) from the channel modules 340. The path allocation system 350 then verifies the validity of the connection and allocates switch resources to set up a dedicated path for the connection to follow. The connection traffic itself will deallocate resources.

Figure 4:
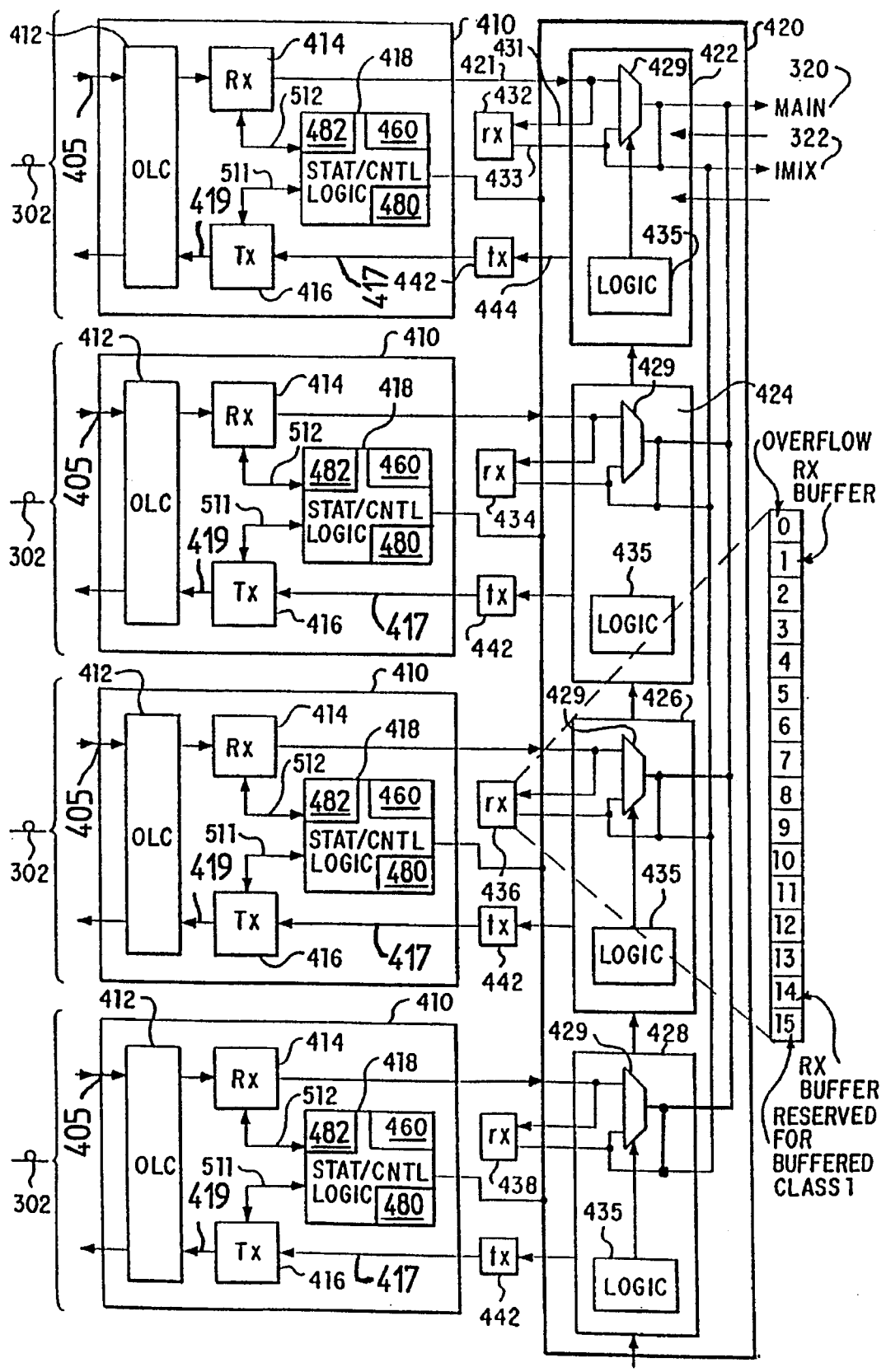
FIG. 4 shows a block diagram of one of the channel modules of FIG. 3.

FIG. 4 shows a block diagram of the channel module architecture for a quad port, 266 Mbaud channel module comprising four port intelligence systems 410 and a memory interface system 420 having four memory interface ASIC's 422, 424, 426 and 428. The architecture for a double port, 531 Mbaud channel module implementation would be similar, except that the 531 implementation employs two port intelligence modules 410. The architecture for a single port, 1062 Mbaud channel module implementation would be similar, except that the 1062 implementation employs four channel modules 410 coupled to the memory interface systems.

Each port intelligence system 410 is coupled to external N_ports through a GLM/OLC transceiver 412. Incoming frames are transferred by the GLM/OLC transceiver 412 to a receiver 414. Status/control logic circuit 418 recognizes when a new frame is received by the receiver 414 and determines the transfer class (either 1 or 2) as well as the length of data from the received frame header information attached to the frame. The purposes of the receiver 414 are to: maintain synchronization with the attached N_port; decode incoming transmission characters, to manage buffer-to-buffer flow control; gather statistics to evaluate link performance; re-time the system clock; detect, check, and validate frames; and forward all frames to the memory interface system 420 for temporary storage in associated receive memory 432, 434, 436 and 438.

The memory interface system 420, in response to commands from the port intelligence system 410 and the path allocation system 350, employs the four memory interface ASIC's 422, 424, 426 and 428 to interface four receive memories 432, 434, 436 and 438 (16 k×16 external RAM) to internal switch data paths via the main bus 320 and imix bus 322. Frames transmitted across receive data path 421 between the port intelligence system 410 and the memory interface system 420 are bit sliced such that memory interface 422 receives bits 0–1, memory interface 424 receives bits 2–3, memory interface 426 receives bits 4–5 and memory interface 428 receives bits 6–7. Each memory interface knows its position and the baud rate at which the channel module 340 is operating. Frames read from receive memories 422, 424, 426 and 428 are reassembled to become byte-wide for traversing the fibre channel switch on the main bus 320 and imix bus 322.

A transmitter 416 is coupled between the memory interface system 420 and the GLM/OLC transceiver 412 and transmits frames that have been forwarded from other channel module receive memories within the fibre channel switch for encoding and transmission according to fibre channel rules. A 4 k×9 FIFO transmit memory 442 is coupled between the memory interface 420 and the transmitter 416 for interfacing the main bus 320 and imix bus 322 to the port intelligence system 410. The memory interface 420 outputs bit-sliced data that is re-formed on the transmit data path 444 at the input of the transmit memory 442.

Each memory interface 422, 424, 426 and 428 includes a multiplexer 429 for providing class 1 data bypass via connection 431 and buffered storage for class 2 data transfers via connection 433 to the receive memory. Additionally, each memory interface includes a memory control logic 435 for controlling the multiplexers 429, the receive memories 432, 434, 436, 438 and the transmit memory 442 in response to commands from the port intelligence system 410 and the path allocation system 350 (FIG. 3).

Each receive memory 432, 434, 436 and 438 is comprised of a set of sixteen memory buffers numbered 0–15 (illustrated in the expanded portion 440 of FIG. 4), each having a storage capacity of two kbytes. Memory buffers numbered 1 through 14 are designated for frame transfers of class 2, memory buffer numbered 15 is reserved for class 1 frames destined for the embedded N_port on the element controller 358 (FIG. 3), and memory buffer number 0 is reserved for overflow. A maximum size frame in accordance with the Fibre Channel industry standard is 2148 bytes long. A binary addressing scheme "PPbbbbxxxxxxxx" is employed for the fourteen memory buffers numbered 1–14 and PP1111bbbbxxxx for the overflow memory buffer numbered 0, where PP identifies the F_port from which the frame is being transferred and bbbb identifies the memory buffer number at which it currently resides.

II. DECODER ARCHITECTURE

As illustrated in FIG. 4, the preferred embodiment of the invention is a decoder 413 located within receiver 414 and is employed for rapidly decoding (at two characters per clock cycle) the incoming 20 bit wide data stream 405 received from the optical interface 412 into a 16-bit wide data stream 421 for transmission to the memory interface 420.

Figure 5:
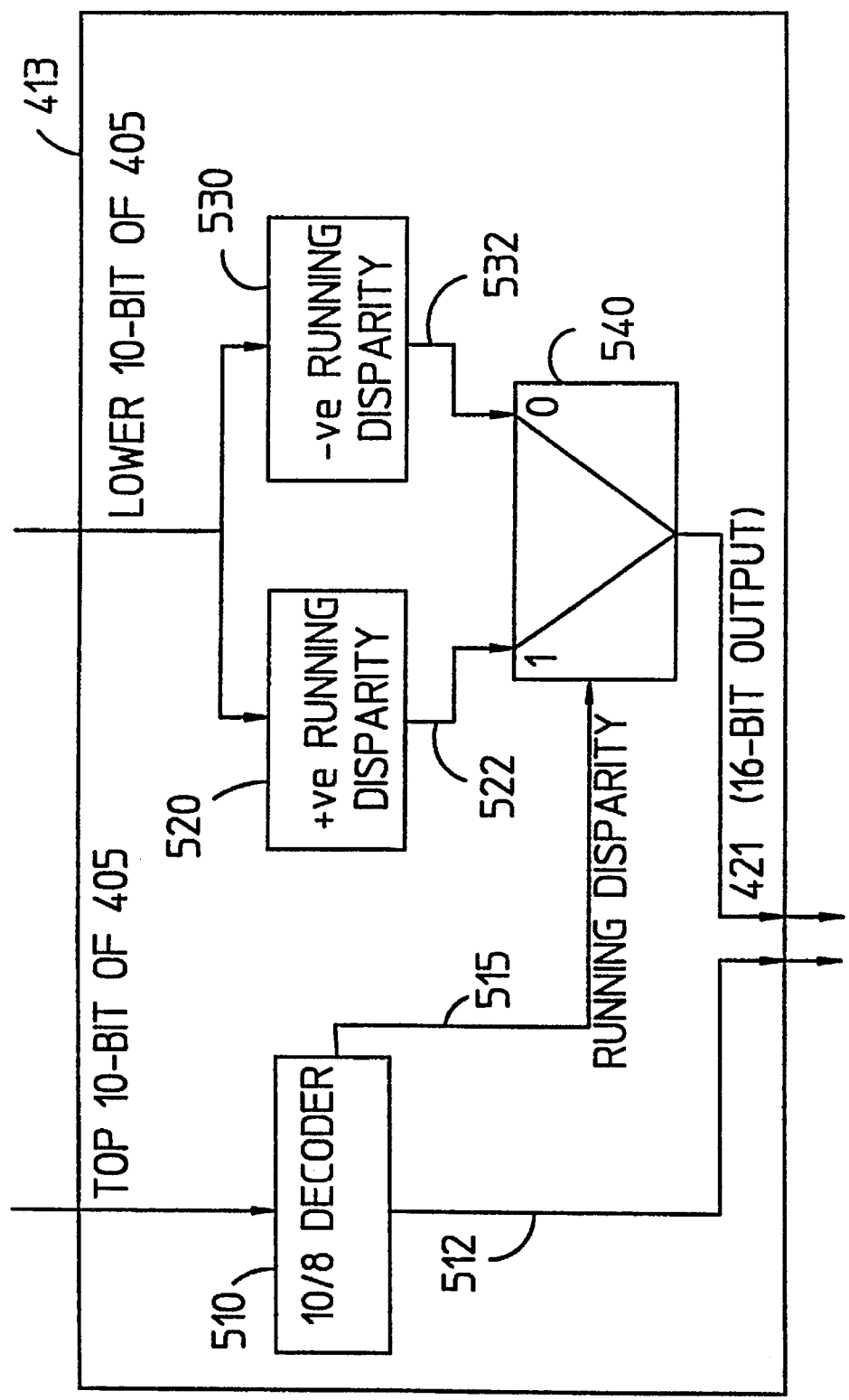
FIG. 5 is a schematic circuit diagram of the invention illustrating the decoder architecture for a twenty to sixteen bit decoder.

In FIG. 5, the decoder 413 is illustrated as comprising a 10/8 bit decoder 510 for translating the first 10-bits of the 20 bit data into an 8-bit data stream 512 and a running disparity bit 515 indicating the carry for selecting either a positive or negative disparity as the decoding of the first 10 bits of the data stream 405 is a function of the running disparity of the second 10 bits. A positive second 10-bit 10/8 bit decoder 520 is employed for decoding the second 10-bits of the 20 bit data into an 8-bit data stream 522 (therefore, the lower 10-bits if the upper 10-bits has a positive carry), and a second negative 10-bit 10/8 bit decoder 530 is employed for translating the second 10-bits of the 20 bit data (therefore, the lower 10-bits if the upper 10-bits has a negative carry) into an 8-bit data stream 532. The 8-bit data stream outputs 522 and 524 are input into a multiplexer 540 along with the running disparity bit 515 for selecting either the negative running disparity result 532 or positive running disparity result 522. This output is coupled with the output of the decoder 510 to generate the 16-bit output 421. The invention allows for two transmission codes to be decoded and the correct on selected within one period of a 53 Mhz clock and is sufficient to support the throughput of a 266 Mbaud, 531 Mbaud or 1 Gbuad fibre channel port.

III. ENCODER ARCHITECTURE

The present invention resides may also be embodied in the transmitter 416 (FIG. 4) employing disparity select to support rapid encoding (53 MHz clock rates and two characters per clock cycle) of the outgoing 16 bit wide data stream 417 from the FIFO transmit buffer 442 into 20-bit wide data 419 for transmission to the GLM optical interface 412 at high speeds.

Figure 6:
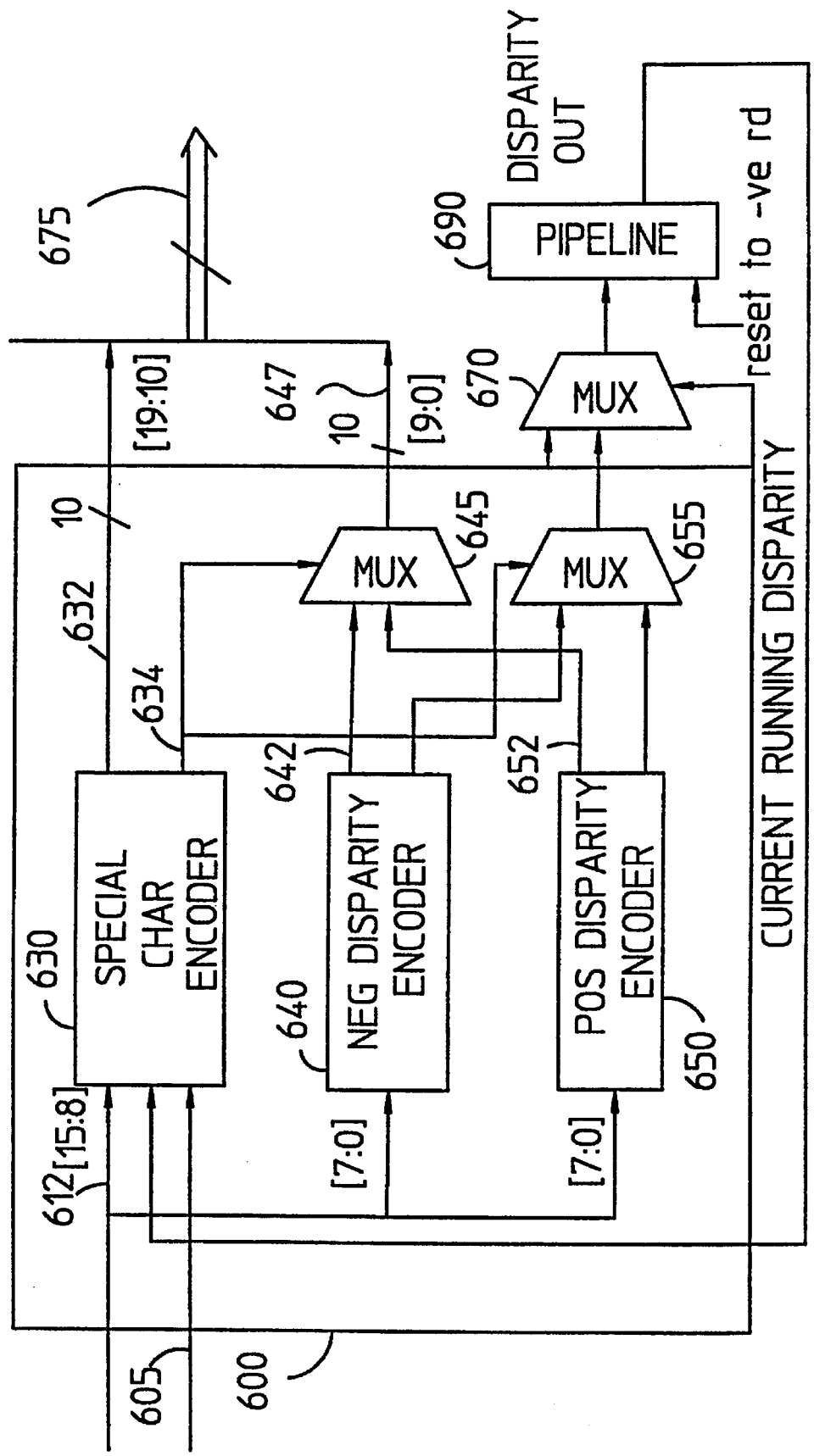
FIG. 6 is a schematic circuit diagram of the invention illustrating the encoder architecture for a sixteen to twenty bit encoder.

FIG. 6 illustrates an encoder 600 for encoding 16-bit data words 605 into a 20-bit encoder output 675. The 16-bit data word is divided into a first 8-bits [15:8] 612 for input into a special character encoder 630 and a lower 8-bits [7:0] for input simultaneously into a negative disparity encoder 640 and into a positive disparity encoder 650.

A multiplexer 645 receives the negative disparity encoder output 642 and the positive disparity encoder output 652. The special character encoder outputs a 10-bit first encoded output, and a running disparity signal 634. The running disparity signal 634 is employed for actuating the multiplexer 645 to select the 10-bit output of either the negative disparity encoder 640 or the positive disparity encoder 650. The 10-bit output 647 of the multiplexer 645 is combined with the special character encoder 10-bit output 632 to form a 20-bit encoded word 675, the 10-bit output 647 corresponding to the second 10 bits [9:0] and the 10-bit output 632 corresponding to the first 10 bits [19:10].

While the present invention has been illustrated and described in connection with the preferred embodiment, it is not to be limited to the particular structure shown. It should be understood by those skilled in the art that various changes and modifications may be made within the purview of the appended claims without departing from the spirit and scope of the invention in its broader aspects.

We claim:

1. An apparatus for decoding incoming 20 bit wide data received from an optical interface into 16-bit wide data comprising:

a first 10-bit 10/8 bit decoder for translating the first 10-bits of the 20 bit data into 8-bits, a positive second 10-bit 10/8 bit decoder for translating of the second 10-bits of the 20 bit data into 8-bits, a negative second 10-bit 10/8 bit decoder for translating the second 10-bits of the 20 bit data into 8-bits, wherein, the running disparity into the first 10-bit decoder is based on the last 20 bit data decoded, and the running disparity out is employed for selecting the first or second 10-bit decoder output, a multiplexer for selecting between the encodings of the positive and the negative second 10-bit disparity decoder based on the output of the running disparity of the first 10-bit decoded output, wherein the output of the first 10-bit 10/8 bit decoder and the multiplexer output are concatenated to form the 16-bit decoded output.

2. The apparatus for high speed decoding as claimed in claim 1, the positive second 10-bit 10/8 bit decoder further comprising an input for receiving the second 10-bits assuming that the running disparity of the decoded upper 10-bits is positive.

3. The apparatus for high speed decoding as claimed in claim 1, the negative second 10-bit 10/8 decoder further comprising an input for receiving the 10-bits for decoding the second 10-bits assuming that the running disparity of the decoded upper 10-bits is negative.

4. The apparatus for high speed decoding as claimed in claim 1, the multiplexer further comprising an input for receiving the running disparity of the decoded first 10-bits into the multiplexer, wherein, the multiplexer selects the output of either the positive second 10-bit decoder or the negative second 10-bit based on the inputted running disparity of the decoded first 10-bits.

5. A method for decoding of 20 bit wide data received from an optical interface into 16-bit wide data, comprising the method steps of:

decoding the first ten bits into eight bit wide data based on the last 20 bits of data decoded, decoding the second ten bits with a positive running disparity into eight bit wide data, decoding the second ten bits with a negative running disparity into eight bit wide data, ascertaining whether the decoded first ten bits has a positive running disparity or a negative running disparity, selecting the decoded second ten bits with a positive running disparity if it is ascertained that the decoded first ten bits have a positive running disparity, selecting the decoded second ten bits decoded assuming a negative running disparity if it is ascertained that the decoded first ten bits have a negative running disparity, generating 16-bit wide data by combining the decoded first ten bits with the selected second ten bits.

6. The method for high speed decoding as claimed in step 5, the step of decoding the second ten bits for a positive running disparity, further comprising the steps of:

inputting the second 10-bits into a positive second 10-bit 10/8 bit decoder for decoding the second 10-bits assuming that the running disparity of the decoded upper 10-bits is positive.

7. The method for high speed decoding as claimed in step 5, the step of decoding the second ten bits for a positive running disparity, further comprising the steps of:

inputting the second 10-bits into a positive second 10-bit 10/8 bit decoder for decoding the second 10-bits assuming that the running disparity of the decoded upper 10-bits is positive.

8. The method for high speed decoding as claimed in claim 5, the step of selecting the positive running disparity and the step of selecting the negative running disparity, further comprising the step of:

inputting the running disparity of the decoded first 10-bits into the multiplexer, actuating the multiplexer to select and output either the positive running disparity or the negative running disparity of the second 10-bit decoder outputs.

9. The method for high speed decoding as claimed in claim 8, the step of generating 16-bit wide data further comprising the step of:

concatenating the output of the first 10-bit 10/8 bit decoder and the output of the multiplexer into the 16-bit wide data.

10. An apparatus for encoding a 16-bit wide data word into a 20-bit wide data word, comprising:

a special character encoder for encoding the first 8-bits of the 16-bit wide data word into 10-bits and for generating a running disparity signal indicating the running disparity of each 10-bit sequence, a negative disparity encoder and a positive disparity encoder employed for simultaneously encoding the second 8-bits of the 16-bit data word to generate a 10-bit sequence having a negative disparity and a 10-bit sequence having a positive disparity, a multiplexer actuated by the running disparity signal that selects either the 10-bit sequence having a positive disparity or the 10-bit sequence having a negative disparity, wherein, the selected 10-bit sequence is combined with the special character encoder 10-bit output to form the 20-bit wide data word.

11. The apparatus for encoding a 16-bit data word as claimed in claim 10, wherein, a tag bit is input along with the 16-bit data word.

12. A method for encoding a 16-bit wide data word into a 20-bit wide data word, comprising the method steps of:

dividing the 16-bit wide multiplexed data word into a top 8-bits and a second 8-bits, encoding the first 8-bits in an 8/10 special character encoder, encoding the second 8-bits in a 8/10 bit negative disparity encoder assuming a negative running disparity, encoding the second 8-bits in a 8/10 bit positive disparity encoder assuming a positive running disparity, inputting the negative disparity encoder output and the positive disparity encoder output into a multiplexer, wherein the running disparity signal output by the special character encoder is employed for selecting the either the negative disparity encoder output or the positive disparity encoder output, and wherein, the 10-bit multiplexer output is concatenated with the 10-bit special character encoder output to form a 20-bit encoded word.

* * * * *